United States Patent [19]

Kramer

[11] 4,352,102

[45] Sep. 28, 1982

[54] LIQUID CRYSTAL DISPLAY OF TIME DEPENDENT SIGNALS

[76] Inventor: Günter Kramer, Falkenring 4a, 3303 Vechelde, Fed. Rep. of Germany

[21] Appl. No.: 89,105

[22] Filed: Oct. 29, 1979

[30] Foreign Application Priority Data

Nov. 13, 1978 [DE] Fed. Rep. of Germany ....... 2849221

[51] Int. Cl.³ .............................................. G09G 3/36
[52] U.S. Cl. .................................... 340/784; 340/753; 340/805
[58] Field of Search ................. 340/754, 784, 753, 805

[56] References Cited

U.S. PATENT DOCUMENTS

| | | | |
|---|---|---|---|
| 2,817,815 | 12/1957 | Evans | 340/754 |
| 3,069,596 | 12/1962 | Morgan | 340/754 |
| 3,696,393 | 10/1972 | McDonald | 340/754 |
| 3,774,195 | 11/1973 | Schulthess et al. | 340/753 |
| 3,835,465 | 9/1974 | Tannas, Jr. et al. | 340/754 |
| 4,021,798 | 5/1977 | Kojima et al. | 340/784 |
| 4,028,692 | 6/1977 | Ngo | 340/784 |
| 4,116,543 | 9/1978 | Stein | 340/784 |
| 4,194,199 | 3/1980 | Shepherd et al. | 340/754 |

*Primary Examiner*—Marshall M. Curtis
*Attorney, Agent, or Firm*—Michael J. Striker

[57] ABSTRACT

A liquid crystal display has a first system of parallel elongated electrodes and a second system of parallel elongated electrodes. The first and second systems are perpendicular to each other. The electrodes in the second system are biased in such a fashion that each electrode in the second system has a greater bias voltage than has the next electrode in the second system. An analog multiplexer connects an analog input signal to all of the electrodes in the first system in a sequential fashion of repeated sweeps. The signal is displayed on the liquid crystal display in a histogram-like format of signal strength versus time.

6 Claims, 1 Drawing Figure

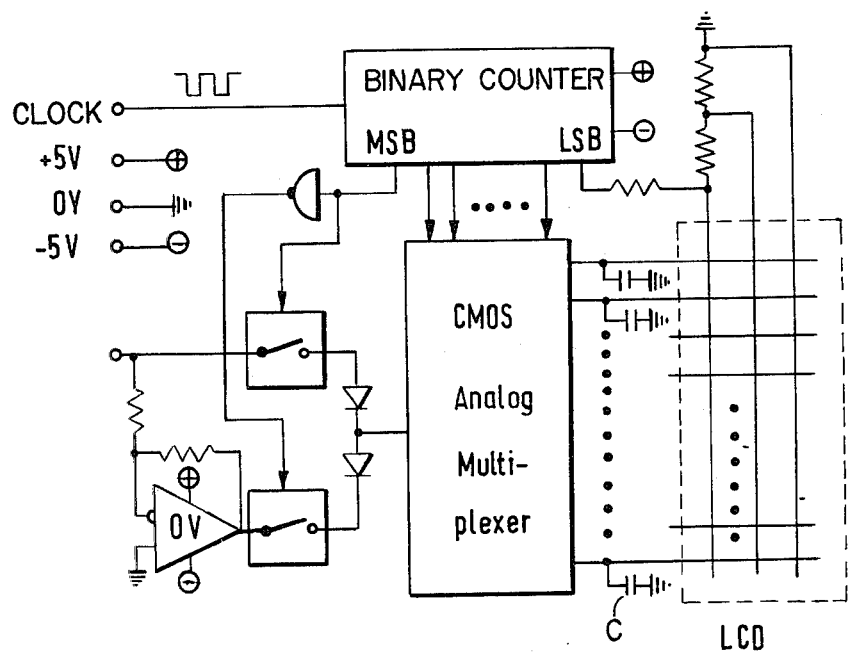

LIQUID CRYSTAL DISPLAY OF TIME DEPENDENT SIGNALS

The invention relates to the design of a liquid crystal display (LCD), for displaying the shape of repetitive signals. The device is particularly suited for displaying the signals from a depth sounder. The standard practice for displaying repetitive signals is to use cathode ray tubes. Depth sounders, on the other hand, more often use lamps that revolve in a circle, the instantaneous brightness of the lamps being proportional to the signal being displayed.

Neither of these systems can easily be read at high ambient light levels or low repetition rates. Instead of displaying all the echoes, many depth sounders therefore electronically select only one, the corresponding depth of water being displayed either digitally or on an analog meter. Such an electronic selection may result in erroneous readings due to spurious echoes from fish or similar objects. On the other hand, with a complete display of the echoes, spurious echoes can be recognised as such.

The invention displays all the echoes in such a way as to be readable even at high ambient light levels.

According to the present invention, the display device uses an LCD with a first system of horizontally elongated electrodes. Each horizontally elongated electrode corresponds to one interval of time and is driven by a voltage derived from the input signal during that time. This is achieved simply by connecting each horizontally elongated electrode to a capacitor, which in turn is connected to the signal source through an electronic switch over the corresponding interval of time interval. Preferably, to display the strength of the signals clearly, a second system of vertically elongated electrodes is also provided crossing electrodes in the first system. The vertically elongated electrodes are biased stepwise each stripe being at a higher voltage relative to the next one. Thus, when an electrode in the first system is at a low voltage, then only those areas overlapping with the most strongly biased electrodes in the second system are excited to threshold. This generates a histogram-like ("bar graph") display of signal strength against time.

The invention will now be described by way of example with reference to the circuit diagram.

The horizontal electrodes of the LCD (LCD) are connected to storage capacitors C and are sequentially connected to the input signal source through the CMOS analog multiplexer. As LCDs should not be operated on dc-voltages, the input signal is inverted by an operational amplifier (OP) Amp and this inverted signal is then used during alternate sweeps. Due to the operation of the diodes, peak values are stored in the capacitors. A binary counter provides the addressing for the analog multiplexer. The output of its first stage (LSB), which is a square wave, is voltage divided to drive the vertically elongated electrodes at different voltage levels. The output of the last binary stage (MSB) effects the inversion of input signal polarity. Synchronisation with the input signal being displayed can be achieved in various ways and has not been shown.

I claim:

1. An instrument for displaying time-dependent signals in a histogram-like format of signal strength versus time, comprising:
   a liquid crystal display having a first system of parallel elongated electrodes and a second system of parallel elongated electrodes, the first and second systems being perpendicular to each other;
   a biasing network connected to the electrodes in the second system and applying bias voltages thereto in a manner that bias voltage of each electrode in the second system is greater than bias voltage of each next electrode in the second system;
   an analog signal input; and
   an electronic switch connecting the analog signal input to all of the electrodes in the first system in a sequential fashion of repeated sweeps.

2. The instrument defined by claim 1, further including a plurality of capacitors, each capacitor being connected between a single corresponding one of the electrodes and ground in a manner that the capacitors and the electrodes in the first system are brought into one-to-one correspondence.

3. The instrument defined by claim 1, wherein the electronic switch is an analog multiplexer.

4. The instrument defined by claim 3, wherein the analog multiplexer is addressed by a clocked binary counter having a least significant bit output, and wherein the second system of electrodes is connected to the least significant bit output.

5. The instrument defined by claim 1, further including an analog signal inverter operating in a manner that polarity of an input signal at the analog signal input is inverted during alternate sweeps.

6. The instrument defined by claim 5, wherein the electronic switch is an analog multiplexer, wherein the analog multiplexer is addressed by a clocked binary counter having a most significant bit output, and wherein the analog signal inverter is connected to the most significant bit output.

* * * * *